(12) United States Patent
Walter et al.

(10) Patent No.: US 9,720,336 B2
(45) Date of Patent: Aug. 1, 2017

(54) MICROLITHOGRAPHIC APPARATUS AND METHOD OF VARYING A LIGHT IRRADIANCE DISTRIBUTION

(71) Applicant: Carl Zeiss SMT GmbH, Oberkochen (DE)

(72) Inventors: Holger Walter, Abtsgmuend (DE); Alexander Wolf, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1 day.

(21) Appl. No.: 14/851,107

(22) Filed: Sep. 11, 2015

(65) Prior Publication Data

US 2016/0004174 A1 Jan. 7, 2016

Related U.S. Application Data

(63) Continuation of application No. PCT/EP2013/000952, filed on Mar. 28, 2013.

(51) Int. Cl.
*G03B 27/54* (2006.01)
*G03F 7/20* (2006.01)
*G02B 27/58* (2006.01)

(52) U.S. Cl.
CPC ......... *G03F 7/70883* (2013.01); *G02B 27/58* (2013.01); *G03F 7/70091* (2013.01); *G03F 7/70266* (2013.01); *G03F 7/70308* (2013.01)

(58) Field of Classification Search
CPC ............. G03F 7/70883; G03F 7/70091; G03F 7/70933; G03F 7/70341
USPC ........................................ 355/30, 53, 67–71
See application file for complete search history.

(56) References Cited

U.S. PATENT DOCUMENTS

| 5,444,336 A | 8/1995 | Ozawa et al. |
| 5,602,683 A | 2/1997 | Straaijer et al. |
| 6,642,994 B2 * | 11/2003 | Mor ............... G03F 7/2022 250/492.2 |
| 7,791,711 B2 | 9/2010 | Holderer et al. |

(Continued)

FOREIGN PATENT DOCUMENTS

| JP | H8-88164 | 4/2002 |
| JP | 2003-142395 | 5/2003 |

(Continued)

OTHER PUBLICATIONS

International Search Report for International Patent Appln No. PCT/EP2013/000952 dated Dec. 12, 2013.

(Continued)

*Primary Examiner* — Hung Henry Nguyen
(74) *Attorney, Agent, or Firm* — Fish & Richardson P.C.

(57) ABSTRACT

A microlithographic apparatus includes an objective that includes a transmission filter that is configured to variably modify a light irradiance distribution in a projection light path. The transmission filter includes a plurality of gas outlet apertures that are configured to emit gas flows that pass through a space through which projection light propagates during operation of the microlithographic apparatus. The transmission filter further includes a control unit which is configured to vary a number density of ozone molecules in the gas flows individually for each gas flow. In this manner it is possible to finally adjust the transmittance distribution of the transmission filter.

14 Claims, 6 Drawing Sheets

(56) References Cited

U.S. PATENT DOCUMENTS

| | | | |
|---|---|---|---|
| 9,081,310 B2* | 7/2015 | Exler | G03F 7/70266 |
| 2002/0085185 A1 | 7/2002 | Helmus et al. | |
| 2002/0191163 A1* | 12/2002 | Hasegawa | G03F 7/70933 355/30 |
| 2006/0092396 A1 | 5/2006 | Lipson | |
| 2006/0262288 A1* | 11/2006 | Govil | G03B 27/54 355/67 |
| 2007/0046921 A1 | 3/2007 | Takahashi et al. | |
| 2009/0040495 A1 | 2/2009 | Schwab | |
| 2009/0226849 A1 | 9/2009 | Tsukamoto | |
| 2010/0112469 A1 | 5/2010 | Miyaharu | |
| 2010/0134891 A1 | 6/2010 | Mueller et al. | |
| 2013/0016331 A1 | 1/2013 | Exler et al. | |

FOREIGN PATENT DOCUMENTS

| | | |
|---|---|---|
| JP | 2006-080108 | 3/2006 |
| JP | 2006-135332 | 5/2006 |
| JP | 2006-324660 | 11/2006 |
| JP | 2007-035671 | 2/2007 |
| JP | 2007-057244 | 3/2007 |
| JP | 2008-270502 | 11/2008 |
| JP | 2010-109186 | 5/2010 |
| JP | 2010-533370 | 10/2010 |
| JP | 2013-524492 | 6/2013 |
| WO | WO 2007/039257 | 4/2007 |
| WO | WO 2011/116792 | 9/2011 |
| WO | WO 2012/123000 | 9/2012 |

OTHER PUBLICATIONS

Japanese Office Action, with English translation thereof for JP Appl. No. 2016-504497, dated Sep. 20, 2016, 12 pages.

* cited by examiner

MICROLITHOGRAPHIC APPARATUS AND METHOD OF VARYING A LIGHT IRRADIANCE DISTRIBUTION

CROSS-REFERENCE TO RELATED APPLICATIONS

The present application is a continuation of, and claims benefit under 35 USC 120 to, international application PCT/EP2013/000952, filed Mar. 28, 2013. The entire disclosure of this application is incorporated by reference herein.

BACKGROUND OF THE INVENTION

1. Field of the Invention

The invention generally relates to the field of microlithography, and in particular to objectives used in projection exposure apparatus or mask inspection apparatus. The invention is particularly concerned with correcting, or more generally varying, a light irradiance distribution in a projection light path in such objectives.

2. Description of Related Art

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV), vacuum ultraviolet (VUV) or extreme ultraviolet (EUV) light. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system, a mask alignment stage for aligning the mask, a projection objective and a wafer alignment stage for aligning the wafer coated with the photoresist. The illumination system illuminates a field on the mask that may have the shape of a rectangular slit or a narrow ring segment, for example.

In current projection exposure apparatus a distinction can be made between two different types of apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or simply scanner, each target portion is irradiated by progressively scanning the mask pattern under the projection light beam in a given reference direction while synchronously scanning the substrate parallel or anti-parallel to this direction. The ratio of the velocity of the wafer and the velocity of the mask is equal to the magnification $\beta$ of the projection lens. A typical value for the magnification is $\beta=\pm\frac{1}{4}$.

It is to be understood that the term "mask" (or reticle) is to be interpreted broadly as a patterning mechanism. Commonly used masks contain opaque, transparent or reflective patterns and may be of the binary, alternating phase-shift, attenuated phase-shift or various hybrid mask type, for example.

One of the essential aims in the development of projection exposure apparatus is to be able to lithographically produce structures with smaller and smaller dimensions on the wafer. Small structures lead to high integration densities, which generally has a favorable effect on the performance of the microstructured components produced with the aid of such apparatus. Furthermore, the more devices can be produced on a single wafer, the higher is the throughput of the production process.

The size of the structures that can be generated depends primarily on the resolution of the projection objective being used. Since the resolution of projection objectives is inversely proportional to the wavelength of the projection light, one way of increasing the resolution is to use projection light with shorter and shorter wavelengths. The shortest wavelengths currently used are 248 nm, 193 nm or 157 nm and thus lie in the deep or vacuum ultraviolet spectral range. Also apparatus using EUV light having a wavelength of about 13 nm are meanwhile commercially available. Future apparatus will probably use EUV light having a wavelength as low as 6.9 nm.

The correction of aberrations (i.e. image errors) is becoming increasingly important for projection objectives having a very high resolution. Other important issues are undesired irradiance variations in field and pupil planes of the objective.

An undesired irradiance variation in the image plane directly translates into CD variations, i.e. variations of the critical dimensions. Irradiance variations in the pupil plane are more difficult to understand. The amplitude part of the complex pupil transmission function describes the angular transmission properties of the objective, while the phase part of the pupil transmission function defines its aberrations.

Mathematically, imaging can be described by two Fourier transforms, namely one from the object plane to the pupil plane and one from the pupil plane to the image plane. Prior to the second Fourier transform, the complex pupil transmission distribution must be multiplied by the optical transfer function (OTF) of the imaging system. The OTF can be split into a phase term W describing the aberrations and an amplitude term A describing how the angular irradiance distribution is affected by the objective. Both terms are generally functions of the pupil coordinates (i.e. of ray directions at field level) and of the field coordinates. This expresses that the amplitude of a light ray generally depends on the position where the light ray impinges in the field, and also on the direction of the light ray. Similar considerations apply also to the phase.

If the term A describing the amplitude distribution has an odd symmetry in the pupil coordinates, this will result in a non-telecentric objective. The term telecentricity denotes the mean direction of a light bundle emerging from or converging to a point in a field plane. In a non-telecentric objective overlay becomes a function of focus, because more light reaches a given point on the image plane from one side than from the other, with the result that if the wafer is moved up or down with respect to the image plane (thus defocusing the exposed image), the image effectively moves horizontally.

If the term A describing the amplitude distribution has an even symmetry so that the light irradiance reaching a given point on the image plane is symmetrical, this affects the optimal exposure dose as a function of structure density (pitch) and orientation: lines of different pitch require a different exposure dose to be printed at the same size.

Apodization is used for eliminating adverse effects that are associated with undesired variations of the irradiance distribution in the pupil plane. The term apodization as used herein generally denotes a modification of the amplitude term A of the OTF by using a filter. Sometimes the term apodization is used in the art to denote an optical filtering of the transmittance in a pupil plane so as to suppress the energy of diffraction rings in an objective.

Usually, there is an ideal irradiance distribution in the pupil plane, and the apodization filter is used to correct the real irradiance distribution so that it approaches at least to some extent the ideal irradiance distribution. Sometimes, however, no correction in this sense is required. For example, it may be possible to vary the irradiance distribution in such a manner that adverse effects caused by the non-ideal irradiance distribution apodization can be eliminated by other measures. Such measures include, among others, modifications of the angular light distribution produced by the illumination system, or displacements of lenses contained in the objective or of the wafer.

If the real irradiance distribution does not vary, it usually suffices to use an apodization filter having a fixed spatial filter function, i.e. an attenuation distribution that cannot be modified. In microlithographic projection exposure apparatus, however, the real irradiance distribution often varies at least to some extent so that it is desirable to be able to vary the filter function of the apodization filter.

U.S. Pat. No. 5,444,336 discloses a projection objective of a microlithographic projection exposure apparatus in which different grey filters can be inserted into the pupil plane of the objective. However, the number of different filter functions is necessarily restricted.

US 2006/0092396 discloses a projection objective of a microlithographic projection exposure apparatus in which a variable apodization filter formed by an array of individually programmable elements, for example LCD cells, is arranged in a pupil plane of the objective. By controlling the elements of the array individually, the attenuation distribution of the apodization filter can be varied. One drawback of this known approach is that it is difficult to finely adjust the attenuation produced by each element.

US 2010/0134891 A1 discloses another variable apodization filter for an objective of a microlithographic projection exposure apparatus. Here a reflective coating applied on a curved mirror surface is detuned so as to locally vary the coefficient of reflection of the mirror. A similar approach is also described in U.S. Pat. No. 7,791,711 B2. However, with this approach it is difficult to ensure that the detuning can be completely reversed.

WO 2011/116792 A1 discloses a wavefront correction device in which a plurality of fluid flows emerging from outlet apertures enter a space through which projection light propagates during operation of the projection exposure apparatus. A temperature control unit sets the temperature of the fluid flows individually for each fluid flow. Since the refractive index of a fluid depends on its temperature, this makes it possible to produce a three-dimensional refractive index distribution. The latter is determined such that optical path length differences associated with the refractive index distribution correct wavefront deformations.

SUMMARY OF THE INVENTION

It is an object of the present invention to provide a microlithographic apparatus comprising a transmission filter that is configured to variably modify a light irradiance distribution in a projection light path, and in particular in a pupil plane of an objective of the microlithographic apparatus. The transmission filter shall be able to finely vary the transmittance in a fully reversible, very flexible and locally resolved manner.

It is also an object of the present invention to provide a method of varying a light irradiance distribution in a projection light path in an objective. The method shall ensure that the transmittance can be finely varied in a fully reversible, very flexible and a locally resolved manner.

In accordance with the present invention, the above stated object with regard to the apparatus is achieved by a microlithographic apparatus, and in particular a microlithographic projection exposure apparatus, comprising an objective that comprises a transmission filter configured to variably modify a light irradiance distribution in a projection light path. The transmission filter comprises a plurality of gas outlet apertures that are configured to emit gas flows that pass through a space through which projection light propagates during operation of the microlithographic apparatus. The transmission filter further comprises a control unit which is configured to vary a number density of ozone molecules in the gas flows individually for each gas flow.

The invention is based on the perception that ozone has a relatively high coefficient of absorption for light in the ultraviolet spectral range. In fact the inventors are not aware of any other gas that has a similarly high coefficient of absorption for ultraviolet light. Thus, by carefully controlling the number density of ozone molecules in the gas flows through which the projection light passes, it is possible to attenuate the projection light to almost any arbitrary degree.

For projection wavelengths in the vacuum ultraviolet (VUV) spectral range, and in particular for 193 nm, the coefficient of absorption is at least substantially constant along a specific gas flow. This is because the number density of ozone molecules does not significantly change in spite of the interaction with the VUV light. More specifically, ozone ($O_3$) dissociates under the impact of the VUV light into molecular oxygen ($O_2$) and exited oxygen radicals ($O^{1D}$). The latter relax, when colliding with molecular oxygen ($O_2$) or other molecules such as molecular nitrogen ($N_2$), into the ground state ($O^{3P}$) and recombine with molecular oxygen ($O_2$) to form ozone ($O_3$) again.

There are different ways to vary the number density of the ozone molecules in the gas flows. In the simplest case the number of ozone molecules that is fed to a purge gas flow is varied. However, since the number density of a gas such as ozone is directly related to its partial pressure, also variations of the partial pressure (either directly or indirectly via temperature changes) may, at least in principle, be used to vary the number density of ozone.

Generally, in order to ensure laminar gas flows, the latter should not intersect each other. Assuming that the gas flows are laminar and propagate along straight lines intersecting the projection light path, the transmittance distribution of the transmission filter is thus given by a superposition of a plurality of stripes, wherein each stripe has a constant transmittance which can be set by adjusting the number density of the ozone molecules.

Not any arbitrary transmittance distribution can be composed by a superposition of such stripes. The range of available transmittance distributions depends not only on the number of outlet apertures, but also on their relative arrangement. For example, groups of outlet apertures may be arranged in parallel planes that are spaced apart along an optical axis of the objective. In order to ensure laminar gas flows, all gas flows within a specific plane should extend parallel to each other. In order to increase the range of possible transmittance distributions, the gas flows may extend along directions that are different for each plane. For example, in the case of two planes the direction of the gas flows in one plane may differ from the direction of the gas flow in the other plane by 90°. In the case of three planes, the directions may differ by 60°, and in the case of four planes, the directions may differ by 45°, and so on. Generally, if the number of outlet apertures is sufficiently high, quasi-continuous transmittance distributions of the transmission filter can be achieved.

For apodization purposes the transmission filter should be arranged in or in close proximity to a pupil plane of the objective. In particular, at least one gas flow should extend through the pupil plane, and (if applicable) gas flows in parallel planes should extend through planes that are arranged in close proximity to the pupil plane.

If the gas flows extend along directions that are at least substantially perpendicular to an optical axis of the objective, this ensures a high symmetry and reduces undesired angle-dependent filter effects.

The transmission filter may comprise at least one transparent optical element that is arranged in the space such that it separates two adjacent gas flows. Such a transparent optical element helps to prevent turbulences in those parts of the transmission filter where adjacent gas flows would otherwise get into contact.

Particularly if groups of outlet apertures are arranged in parallel planes, the at least one transparent optical element may be a plate having parallel plane surfaces, including thin transparent membranes. The at least one plate may be arranged perpendicular to the optical axis of the objective so that it separates two planes from each other. If a plurality of such plates is provided, they may form a stack, wherein pairs of adjacent plates define an interspace through which parallel gas flows extend during operation of the transmission filter.

If (also) a lateral contact of gas flows shall be avoided, thin plates may be provided that extend parallel to the optical axis. In combination with plates extending perpendicular to the optical axis, the thin plates then define channels having a rectangular cross section, for example, for each gas flow. This further reduces the risk of undesired turbulences in the gas flows.

In one embodiment the control unit comprises a gas supply unit that is connected to the gas outlet apertures. The gas supply unit is configured to produce the gas flows with a variable ozone number density.

In principle only ozone may emerge from the gas outlet apertures, with no other gas present. However, this would require that if no absorption is desired, a vacuum has to be maintained in the transmission filter.

For that reason each gas flow comprises, in one embodiment of the invention, a purge gas which is preferably a gas having a low reactiveness, but which is simultaneously completely transparent for the projection light and thus does not contribute to the attenuation produced by the transmission filter. Molecular nitrogen ($N_2$) is suitable for this purpose, for example, but also mixtures from different gases are contemplated.

The refractive index of the gas flows depends on their pressure. If the number density of ozone in a gas flow is varied while the number density of the purge gas remains unchanged, this inevitably results in a variation of the pressure, and thus also of the refractive index, in the gas flow. Since this is generally undesirable because it compromises the imaging quality of the objective, the control unit may be configured to vary the number density of the purge gas atoms or molecules individually for each gas flow in such a way that for each gas flow the total pressure does not vary, or at least does not vary by more than 0.5%, preferably by not more than 0.1%, if the number density of ozone is varied. In other words, the partial pressure of the purge gas is varied so as to compensate any variations of the partial pressure of the ozone so that the sum of the partial pressures is kept constant. Then also the refractive index of the gas flow does not vary.

The controlled variation of the partial pressure of the purge gas might also be used to correct refractive index variations that are caused by the difference in molar refractive index of ozone compared to the purge gas and by the local increase in temperature due to the absorption of projection light by ozone.

In another embodiment, the gas supply unit comprises a purge gas container, a channel connected at one end to the purge gas container and terminating at an opposite end at one of the gas outlet apertures, an ozone container and a control valve. The latter is configured to feed, per time unit, variable numbers of ozone molecules taken from the ozone container into the purge gas that is guided through the channel so as to vary the number density of the ozone molecules in the gas flow that emerges from the gas outlet aperture into which the channel terminates. This results in a very simple construction, with the control valves being the only devices containing movable components.

Instead of providing an ozone container, the gas supply unit may comprise a gas container containing a gas comprising molecular oxygen and a channel connected at one end to the gas container and terminating at an opposite end at one of the gas outlet apertures. The gas supply unit further comprises a light source which is configured to produce reaction light having a center wavelength less than 240 nm, and preferably less than 180 nm, and more preferably less than 160 nm. The reaction light is directed on the gas guided in the channel such that at least a portion of the molecular oxygen contained in the gas dissociates into atomic oxygen which, in turn, recombines with molecular oxygen to form ozone. The number density of ozone molecules in the gas flows can then be varied by varying the irradiance of the reaction light directed on the gas. In this embodiment the ozone is thus produced in the microlithographic apparatus using a chemical reaction as it also occurs in the atmosphere of the earth.

If the projection light has a sufficiently short center wavelength, it is also possible to use the projection light as reaction light. For example, a portion of the projection light is split off (e.g. using a beam splitter) from the projection light beam and directed via mirrors or other optical elements towards the transmission filter, where it dissociates molecular oxygen as described above. Alternatively, the projection light beam itself produces the ozone in the transmission filter when it passes through it. In that case, however, the number density of the ozone molecules in each gas flow may be inhomogeneous in a manner that is difficult to control. Furthermore, the number density of ozone molecules may be highest where the irradiance of the projection light is highest, too. In a typical apodization filter this is often not desired.

The microlithographic apparatus may further comprise a measurement system which is configured to measure an angular light distribution in an image plane of the objective. If such a measurement system is connected to the control unit of the transmission filter, the light irradiance distribution in the projection light path can be varied in response to measurement signals that are produced by the measurement system. This makes it possible to perform an open-loop or a closed-loop control of the transmission filter.

The transmission filter may further comprise a suction unit which is configured to suck off the gas flows after they have passed through the space. This supports the laminarity of the gas flows.

With regard to the method, the above stated object is achieved by a method of varying a light irradiance distribution in a projection light path in an objective. The method comprises the following steps:
a) guiding a plurality of gas flows through a space through which projection light propagates during operation of the microlithographic apparatus; and
b) varying a number density of ozone molecules in the gas flows individually for each gas flow;
wherein the objective is contained in a microlithographic apparatus.

The method may comprise the further steps of measuring an angular light distribution in an image plane of the objective, and, by varying the number density of ozone molecules in the gas flows, varying the light irradiance distribution in the projection light path in such a way that a deviation of the measured angular light distribution from a target angular light distribution is reduced.

The method may further comprise the step of producing the ozone by irradiating a gas comprising molecular oxygen with reaction light having a central wavelength less than 240 nm, and preferably less than 180 nm, and more preferably less than 160 nm.

In an alternative that does not form part of the claimed invention, it is not a number density of ozone molecules that is individually varied in the gas flows, but a number density of nano particles. A particle is referred to as a nano particle if its maximum dimension is smaller than 100 nm.

If such nano particles, and in particular nano particles having a maximum dimension of less than 50 nm and preferably less than 25 nm, are present in a gas flow passing through a space through which projection light propagates during operation of the microlithographic apparatus, a portion of the projection light will be scattered or absorbed so that it does not reach the image plane of the objective. Thus it is possible, by individually varying the number density of the nano particles in the gas flows, to produce a wide variety of transmittance distributions in the projection light path in substantially the same manner as it has been described above with reference to the number density of ozone molecules.

The nano particles are preferably inorganic particles. Silver, wolfram, titan dioxide or silicon dioxide particles are suitable in this respect. Such nano particles may be produced by vaporization, spraying, abrasion or spark generation, for example.

Since nano particles may deposit on the optical surfaces of transparent optical elements confining the gas flows, it may be necessary to replace these optical elements after some time, or to guide the gas flows through the space, through which projection light propagates, using other approaches, for example electrical or magnetic fields.

The nano particles may also be produced by dispersing liquids, in particular with the help of ultrasonic waves. If such particles deposit on an optical surface, they evaporate without leaving any residuals.

DEFINITIONS

The term "number density of ozone molecules" is used herein to denote the ratio N/V, wherein V is a volume and N is the number of ozone molecules that are, at a given time, contained in the volume V.

The term "light" is used herein to denote any electromagnetic radiation, in particular visible light, UV, DUV and VUV light.

The term "light ray" is used herein to denote light whose path of propagation can be described by a line.

The term "light beam" is used herein to denote a plurality of light rays. A light beam usually has an irradiance profile across its diameter that may vary along the propagation path. A single light beam can usually be associated with a single point or extended light source.

The term "surface" is used herein to denote any planar or curved surface in the three-dimensional space. The surface may be part of a body or may be completely separated therefrom.

The term "optically conjugate" is used herein to denote an imaging relationship between two points or two surfaces. Imaging relationship means that a light bundle emerging from a point converges at the optically conjugate point.

The term "field plane" is used herein to denote a plane that is optically conjugate to the mask plane.

The term "pupil plane" is used herein to denote a plane in which all light rays, which converge or diverge under the same angle in a field plane, pass through the same point. As usual in the art, the term "pupil plane" is also used if it is in fact not a plane in the mathematical sense, but is slightly curved so that, in a strict sense, it should be referred to as pupil surface.

BRIEF DESCRIPTION OF THE DRAWINGS

Various features and advantages of the present invention may be more readily understood with reference to the following detailed description taken in conjunction with the accompanying drawings in which.

DESCRIPTION OF PREFERRED EMBODIMENTS

I.

General Construction of Projection Exposure Apparatus

Figure 1:
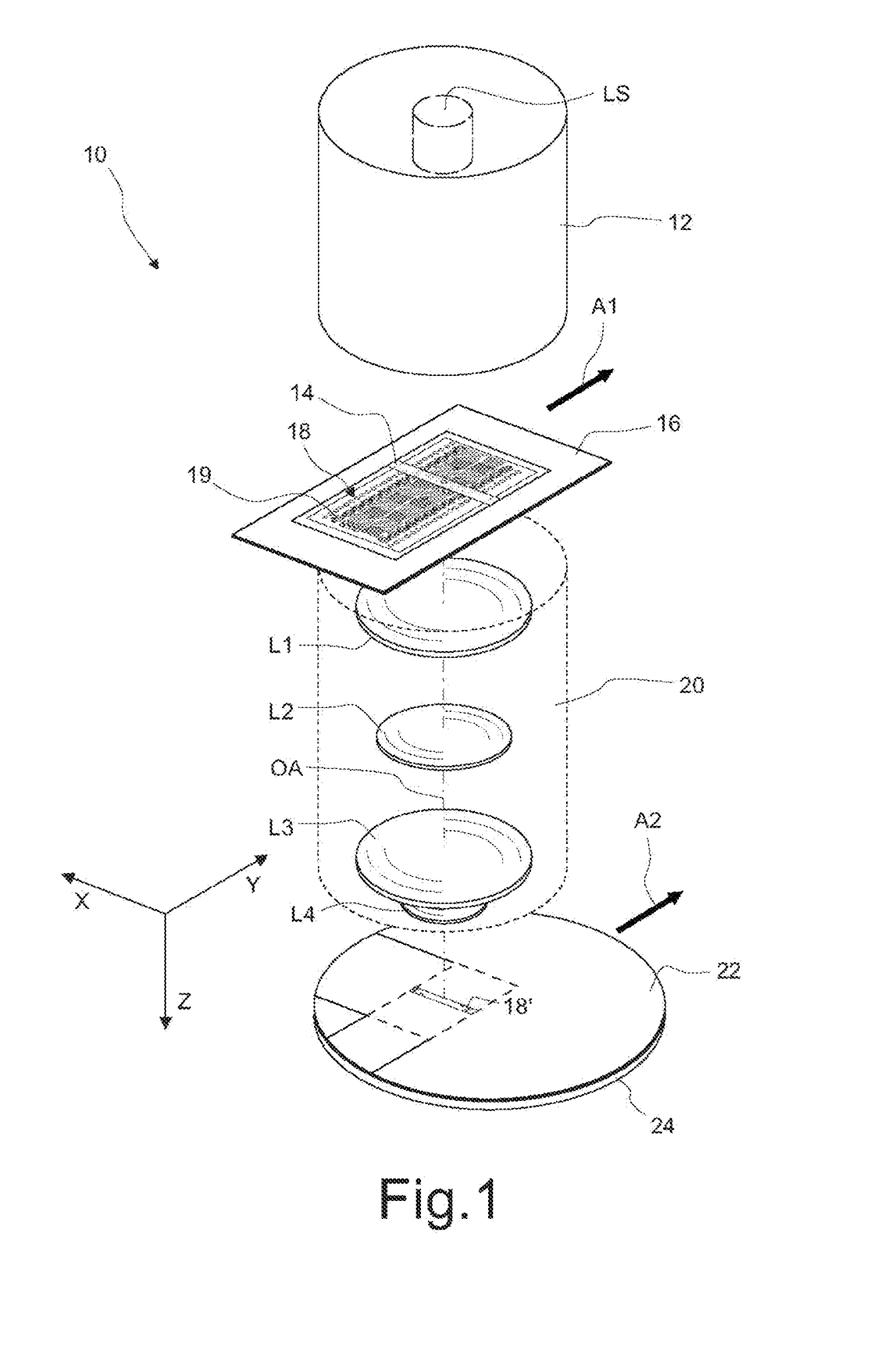
FIG. 1 is a schematic perspective view of a projection exposure apparatus in accordance with the present invention.

FIG. 1 is a perspective and simplified view of a microlithographic projection exposure apparatus 10 in accordance with the present invention. The apparatus 10 comprises an illumination system 12 containing a light source LS which produces projection light having a central wavelength of 193 nm. The projection light illuminates a field 14 on a mask 16 comprising a pattern 18 of fine features 19. In this embodiment the illuminated field 14 has a rectangular shape. However, other shapes of the illuminated field 14, for example ring segments, and also other central wavelengths, for example 157 nm or 248 nm, are contemplated as well.

A projection objective 20 having an optical axis OA and containing a plurality of lenses L1 to L4 images the pattern 18 within the illuminated field 14 on a light sensitive layer 22, for example a photoresist, which is supported by a substrate 24. The substrate 24, which may be formed by a silicon wafer, is arranged on a wafer stage (not shown in FIG. 1) such that a top surface of the light sensitive layer 22 is precisely located in an image plane of the projection objective 20. The mask 16 is positioned via a mask stage (not shown in FIG. 1) in an object plane of the projection objective 20. Since the latter has a magnification β with |β|<1, a minified image 18' of the pattern 18 within the illuminated field 14 is projected onto the light sensitive layer 22.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the magnification β of the projection objective 20. If the projection objective 20 does not invert the image (β>0), the mask 16 and the substrate 24 move along the same direction, as this is indicated in FIG. 1 by arrows A1 and A2. However, the present invention may also be used with catadioptric projection objectives 20 having off-axis object and image fields, and with apparatus of the stepper type in which the mask 16 and the substrate 24 do not move during the projection.

Figure 2:
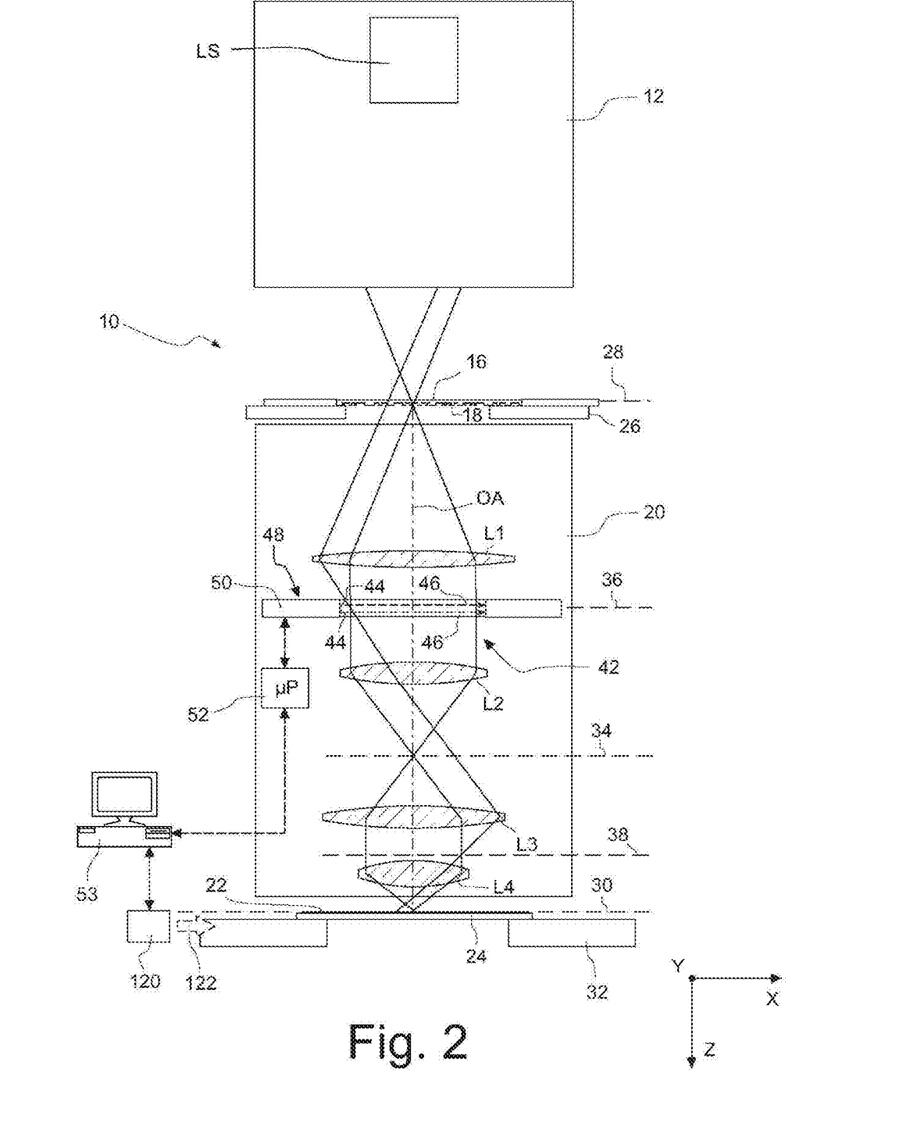
FIG. 2 is a schematic meridional section through the apparatus shown in FIG. 1.

FIG. 2 is a schematic meridional section through the apparatus 10 shown in FIG. 1. In this section also the mask stage denoted by 26, which supports and moves the mask 16 in the object plane 28 of the projection objective 20, and the wafer stage denoted by 32, which supports and moves the substrate 24 in the image plane 30 of the projection objective 20, are schematically illustrated.

In this embodiment the projection objective 20 has an intermediate image plane 34. A first pupil plane 36 is located between the object plane 28 and the intermediate image plane 34, and a second pupil plane 38 is located between the intermediate image plane 34 and the image plane 30 of the projection objective 20. As this is illustrated in FIG. 2, all light rays converging or diverging under the same angle from any of the field planes, i.e. the object plane 28, the intermediate image plane 34 and the image plane 30, pass through the same point in the first and second pupil plane 36, 38, respectively.

In the first pupil plane 36 a transmission filter 42 is arranged. The transmission filter 42 corrects, or more generally variably modifies, the light irradiance distribution in the first pupil plane 36. Due to its arrangement in one of the pupil planes 36, 38 of the projection objective 20, the transmission filter 42 may be used as an apodization filter that absorbs portions of projection light that would, if allowed to reach the image plane 30, deteriorate the quality of the image of the mask 16.

The transmission filter 42, which is shown only very schematically in FIG. 2, comprises a plurality of gas outlet apertures 44 that are configured to emit gas flows 46 through which the projection light propagates, and a control unit 48 that is configured to vary the number density of ozone molecules in the gas flows 46 individually for each gas flow 46. To this end the control unit 48 comprises a gas supply unit 50 and a computational unit 52 that is connected to the gas supply unit 50. The computational unit 52 is, in turn, connected to an overall system control 53 of the apparatus 10.

An embodiment of the transmission filter 42 will be described in more detail with reference to FIGS. 3 and 4 in the following section.

II.

Design of Transmission Filter

Figure 3:
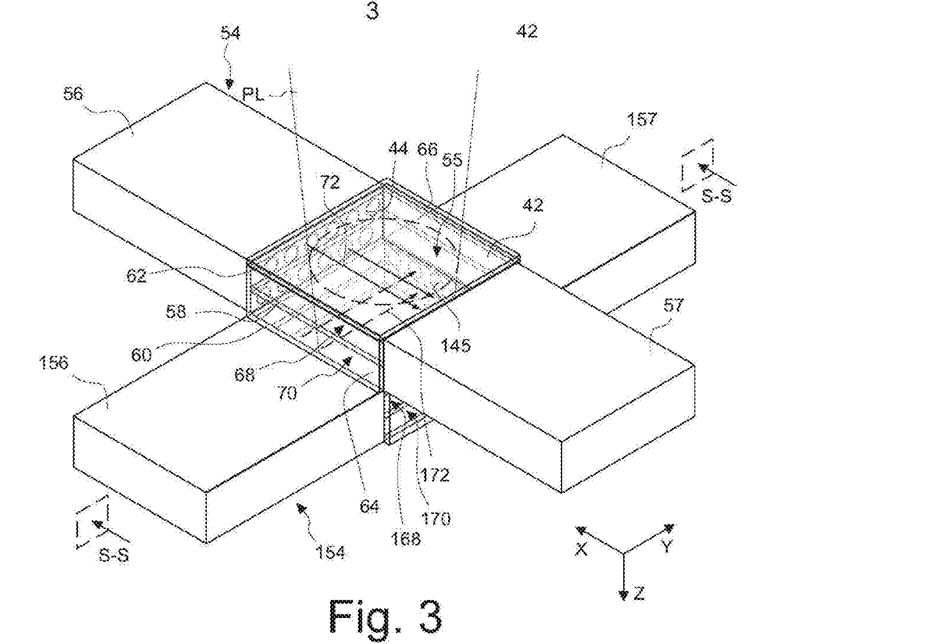
FIG. 3 is a schematic perspective view on a transmission filter contained in the apparatus shown in FIGS. 1 and 2 according to a first embodiment.

FIG. 3 is a simplified and not to scale perspective view on the transmission filter 42. The transmission filter 42 comprises a first filter unit 54 comprising a gas supply unit 56 and a suction unit 57. Components that are contained in these units will be described in more detail further below with reference to FIG. 4. The units 56, 57 are spaced apart by a substantially empty space 55 through which projection light PL propagates during operation of the apparatus 10.

The gas supply unit 56 is connected to two rows of gas outlet apertures 44 that have, in the embodiment shown, a circular cross section. The rows are arranged along the Y direction in a staggered manner. The two rows of gas outlet apertures 44 are arranged in two parallel planes that are separated by a horizontal glass plate 58. Two additional horizontal glass plates 60, 62 arranged parallel to the horizontal glass plate 58, two vertical glass plates 64, 66 and the units 56, 57 commonly define an upper cavity 68 and a lower cavity 70 (see also cross section of FIG. 4). The height of the cavities 68, 70 may be as small as 1 mm. During operation of the transmission filter 42, gas flows 72 propagate through the cavities 68, 70 along the –X direction. The gas flows 72 are emitted by the gas outlet apertures 44 that are arranged at one end of each cavity 68, 70.

The suction unit 57 is connected to a similar arrangement of gas inlet apertures from which the gas flows 72 are sucked off after having traversed the cavities 68, 70. The gas inlet apertures are arranged opposite the gas outlet apertures 44 in a one to one correspondence, but cannot be seen in FIG. 3.

The transmission filter 42 further comprises a second filter unit 154 having the same overall design as the first filter unit 54. For that reason components of the second filter unit 154 are designated with reference numerals augmented by 100 as compared to corresponding components of the first filter unit 54.

The second filter unit 154 is rotated by 90° with respect to the first filter unit 54. For that reason the gas flows 72 in the first filter unit 54 on the one hand and the gas flows 172 in the second filter unit 154 extend along orthogonal directions. In FIG. 3 only the gas inlet apertures 145 of the second filter unit 154 can be seen that suck off the gas flows 172 after having traversed the cavities 168, 170.

Figure 4:
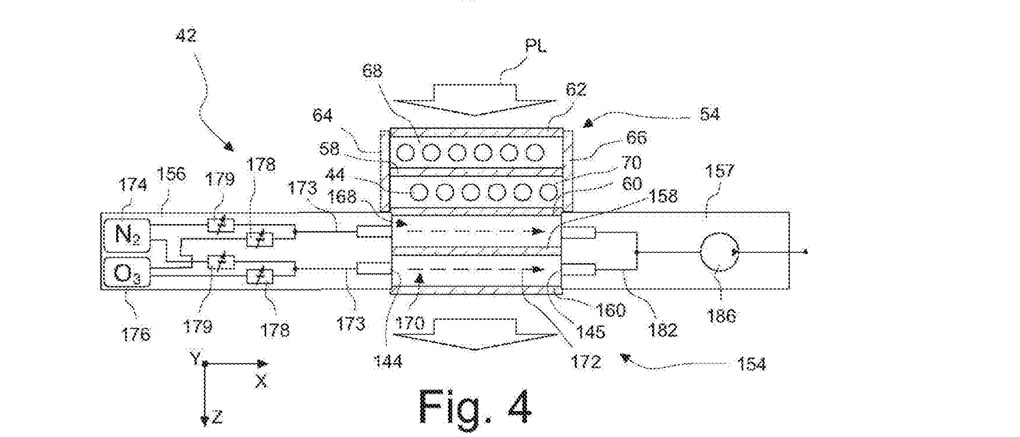
FIG. 4 is a schematic cross section through the transmission filter shown in FIG. 3.

FIG. 4 is a cross sectional view through the transmission filter 42 as shown in FIG. 3 along a sectional plane which is indicated in FIG. 3 by S-S. The gas supply unit 156 of the second filter unit 154 contains a plurality of channels 173. Each channel 173 is fluidically connected at one end to one of the gas outlet apertures 44. At the opposite end each channel 173 bifurcates into two channel sections that terminate at a purge gas container 174 containing a purge gas and an ozone container 176 containing ozone, respectively. In the embodiment shown nitrogen ($N_2$) is used as purge gas. Generally, the purge gas should have a negligible coefficient of absorption for the projection light PL.

An ozone control valve 178 is provided in the channel section between the ozone container 176 and the bifurcation point that is associated to a particular gas outlet aperture 144. The ozone control valve 178, which is controlled by the computational unit 52, is configured to feed, per time unit, variable numbers of ozone molecules taken from the ozone container 176 into the channel section that finally leads to the gas outlet aperture 144. In this manner the number density of ozone molecules in the gas flows 172 emerging from the gas outlet apertures 144 can be adjusted finely and individually for each gas outlet aperture 144 with the help of the ozone control valves 178.

A purge gas control valve 179 is provided in the channel section between the purge gas container 174 and the bifurcation point that is associated to a particular gas outlet aperture 144. The purge gas control valve, which is also controlled by the computational unit 52, is configured to feed, per time unit, variable numbers of purge gas atoms or molecules taken from the purge gas container 174 into the channel section that finally leads to the gas outlet aperture 144. In this manner the number density of purge gas atoms or molecules in the gas flows 172 emerging from the gas outlet apertures 144 can be adjusted finely and individually for each gas outlet aperture 144 with the help of the purge gas control valves 179.

The gas supply unit 56 of the first filter unit 54 has the same construction and therefore contains ozone control valves 78 (not shown in the figures) and purge gas control valves 79 (not shown in the figures) for controlling the number density of ozone and purge gas atoms or molecules of the gas flows 72.

The suction unit 157 of the second filter unit 154 comprises channels 182 connecting the gas inlet apertures 145 to a suction pump 186. The suction pump 186 produces a negative pressure so that the gas emerging from the gas outlet apertures 144 is sucked off by the suction unit 180 and forms a plurality of laminar gas flows 172 extending through the cavities 168, 170. Since the number density of ozone molecules can be controlled individually for each gas flow 172, it is possible to produce a non-homogenous number density of ozone molecules in the cavities 168, 170. As a matter of course, the same also applies to the gas flows 72 in the cavities 68, 70 of the first filter unit 54.

The function of the transmission filter 42 shown in FIGS. 3 and 4 will be explained in the following with reference to FIGS. 5 to 8.

III.

Function of Transmission Filter

For the sake of simplicity, it will be assumed in the following that only purge gas, but no ozone enters the cavities 70, 170 in the first and second filter unit 54, 154. Thus the transmittance of the transmission filter 42 is only determined by the number density of ozone molecules in the other two cavities 68 and 168, which are controlled by the ozone control valves 78, 178.

Figure 5:
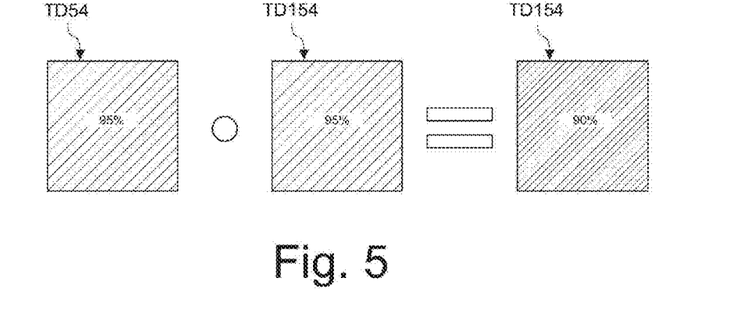
FIGS. 5 to 8 are graphs illustrating how a total transmittance distributions of the transmission filter is obtained by combining different transmittance distributions of first and second filter units contained in the transmission filter shown in FIGS. 3 and 4.

FIG. 5 illustrates the transmittance distribution of the transmission filter 42 if all ozone control valves 78, 178 of the first and second filter unit 54, 154 feed, per time unit, the same number of ozone molecules into the cavities 68, 168. Then a homogenous number density of ozone molecules is obtained in the cavities 68, 168. Consequently, the coefficient of absorption, which depends sensitively on the number density of ozone molecules, is equal at each point in the cavities 68, 168. If each cavity 68, 168 has a height along the optical axis OA of 1 mm and the wavelength of the projection light PL is 193 nm, an ozone molecule number density of about $1.026 \cdot 10^{18}$ molecules/cm$^3$ in the gas flows 72 extending through the cavity 68 in the first filter unit 54 will reduce the transmittance by 5% to 95%. The transmittance distribution TD54 of the first filter unit 54 is illustrated in FIG. 5 on the left hand side.

The same also applies to the gas flows 172 extending through the cavity 168 in the second filter unit 154. Therefore also the second filter unit 154 reduces the transmittance by 5% to 95%, as it becomes clear from the transmittance distribution TD154 shown in the central portion of FIG. 5.

The combined effect of the first and second filter unit 54, 154 is obtained by multiplying the transmittance distributions TD54, TD154 at each XY coordinate. As illustrated on the right hand side of FIG. 5, the homogeneous number density of ozone molecules of about $1.026 \cdot 10^{18}$ molecules/cm$^3$ in the first and second filter units 54, 154 results in a uniform transmittance distribution TD42 of 90% over the entire transmission filter 42.

Figure 6:
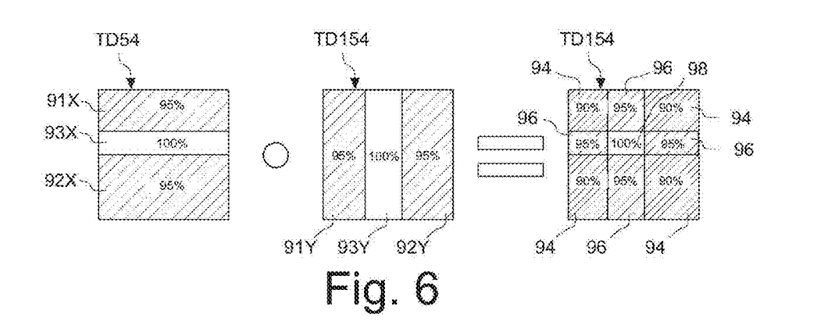

In FIG. 6 a similar control of the control valves 78a, 178 is assumed. However, here some ozone control valves 78, 178 are controlled so that the gas flows 72 associated with these valves do not contain any ozone at all. In that case the transmittance associated with these gas flows is equal to the transmittance of the purge gas nitrogen, which is approximately 100%. The remaining gas flows again reduce the transmittance by 5%.

The first filter unit 54 then produces a transmittance distribution TD54 shown on the left hand side of FIG. 6 and consisting of two stripes 91X, 92X with T=95% that extend along the X direction, and a third stripe 93X with T=100% that extends between the first and second stripes 91X, 92X.

Similarly, the second first filter unit 154 then produces a transmittance distribution TD154 shown in the central portion of FIG. 6 and consisting of two stripes 91Y, 92Y with T=95% that extend along the Y direction, and a third stripe 93Y with T=100% extending between the first and second stripes 91Y, 92Y.

The combined effect of the first and second filter unit 54, 154 is illustrated on the right hand side of FIG. 6. It can be seen that the transmittance distribution TD42 of the entire transmission filter 42 is now more complex. Namely, it contains four areas 94 with T=90%, four areas 96 with T=95%, and a central area 98 with T=100%.

Figure 7:
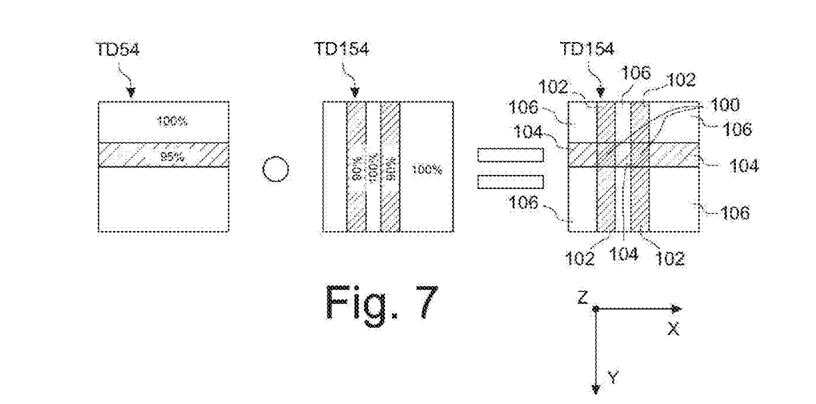

FIG. 7 illustrates the case in which only a few gas flows 72, 172 have a non-zero number density of ozone molecules as indicated on the left hand side and in the center portion of FIG. 7. The combined effect of the transmittance distributions TD54, TD154 of the first and second filter units 54, 154, respectively, is again shown on the right hand side. The transmittance distribution TD42 of the entire transmission filter 42 comprises two areas 100 with a minimum transmittance T=85%, four areas 102 with T=90%, three areas 104 with T=95%, and the remaining six areas 106 with the maximum transmittance T=100%.

It will be appreciated from the foregoing that by carefully controlling the ozone control valves 78, 178 it is possible to produce a wide variety of different transmittance distributions in the optical path of the projection light PL. This particularly holds true if the number density of ozone molecules in a very large number of gas flows 72, 172, for example several hundreds or even several thousand, can be set independently for each gas flow. If the gas flows 72, 172 extend in different planes not only along two, but three or more different directions through the space 55 through which the projection light PL propagates, this further enhances the number of different transmittance distributions TD42 that can be produced by the transmission filter 42.

Generally, the resolution of the transmittance distributions TD42 depends on the width of the gas flows 72, 172. Since this width cannot be reduced to arbitrary small values, each filter unit 54, 154 contains not only one, but two cavities through which gas flows pass. Since the gas outlet apertures 44, 144 are laterally offset in these cavities 68, 70 and 168, 170, the resolution is in fact increased by 2. This can be seen best in FIG. 4 in which the row of gas outlet apertures 44 in the cavity 68 is laterally offset with respect to the row of outlet apertures 44 in the other cavity 70.

Figure 8:
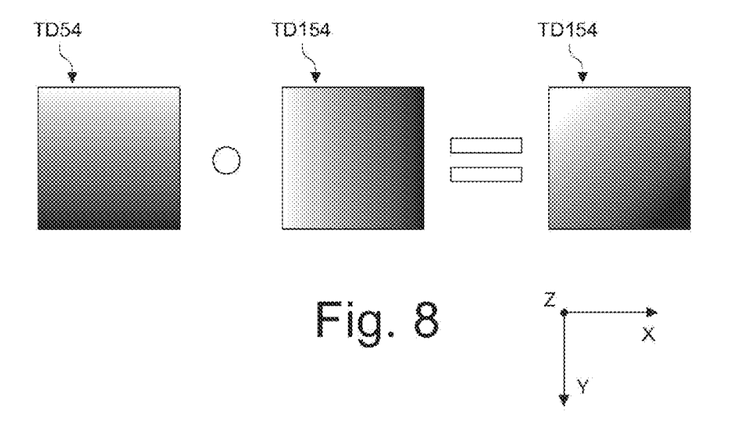

FIG. 8 illustrates the case in which the number of individually controllable gas outlet apertures 44, 144 is increased to such an extent that a quasi-continuous distribution of the number density of ozone molecules can be obtained in the space 55 through which the projection light PL propagates. Consequently, also the transmittance distribution TD42 of the transmission filter is quasi-continuous, as this is shown on the right hand side of FIG. 8. Here it is assumed that in the transmittance distribution TD54 of the first filter unit 54 the transmittance increases continuously along the −Y direction. In the transmittance distribution TD 154 of the second filter unit 154 the transmittance increases continuously along the −x direction. In the combined transmittance distribution TD42 the transmittance increases along a diagonal direction.

In the foregoing it has been assumed that only one of the ozone control valves 78, 178 is operated if the number density of ozone molecules in one of the gas flows 72, 172 is varied. However, a variation of the number density of ozone molecules inevitably involves a pressure change if the number density of purge gas atoms or molecules is kept constant. Such pressure changes translate into changes of the refractive index. Then a change of the transmission distribution TD42 will always be accompanied by undesired phase changes of an optical wavefront passing through the transmission filter 42.

If such phase changes cannot be tolerated, the purge gas control valves 79, 179 may be operated, on the basis of a suitable control algorithm scheme performed in the computational unit 52, that for each gas flow the total pressure does not vary if the number density of ozone molecules is varied. For example, if the number density of ozone molecules is increased in a gas flow, the number density of purge gas atoms or molecules is simultaneously decreased to such an extent that the total pressure remains substantially constant. If the total pressure shall remain constant only roughly, the control scheme may simply require that if the flow through one of the control valves 78, 178 increases by Δ, the flow through the purge gas control valve associated to the same gas outlet aperture 44, 144 decreases by −Δ, and vice versa.

A more sophisticated control scheme may involve a closed-loop control in which the total pressure is measured in the suction unit 57, 157. Then also other causes for undesired variations of the total pressure in the gas flows 72, 172 can be compensated. Such causes include temperature changes in the gas flows 72, 172 that are the result of the partial absorption of the projection light PL by the ozone molecules.

IV.

Second Embodiment of Transmission Filter

Figure 9:
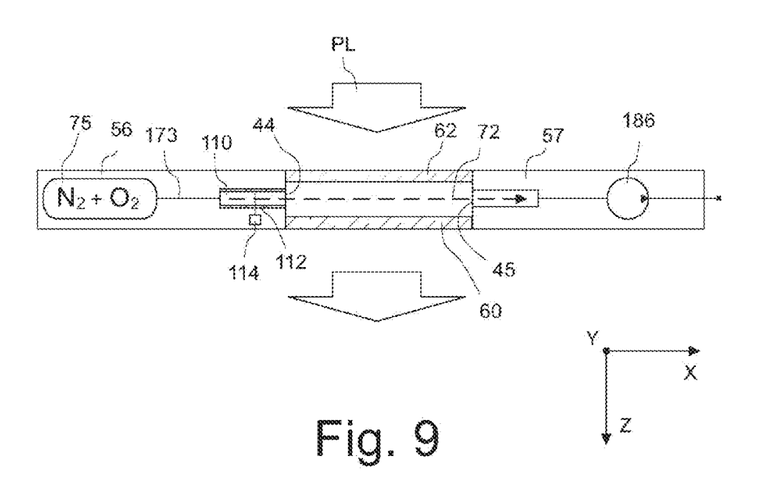
FIG. 9 is a schematic cross section through a transmission filter according to a second embodiment.

FIG. 9 is a cross section similar to FIG. 4 through a second embodiment of a transmission filter. In this embodiment the transmission filter 42 has only one cavity 68 and a single row of gas outlet apertures 44.

Furthermore, the gas supply unit 56 does not contain two separate containers for purge gas and ozone, but only a single gas mixture container 75 that contains a mixture of a purge gas (here again molecular nitrogen $N_2$) and molecular oxygen $O_2$. Each gas outlet aperture 44 is fluidically connected to the gas mixture container 75 via a reaction chambers 110. The wall of the reaction chamber 110 contains a window 112 made of calcium fluoride ($CaF_2$) which is transparent for VUV light having a wavelength below 170 nm. The gas supply unit 56 further comprises, for each reaction chamber 110, a light source 114 which is configured to emit VUV light having a wavelength of 157 nm. The light of the light source 114, which will be referred to in the following as reaction light, is directed to the window 112 so that it enters the reaction chamber 110. The light source 114 may be an excimer laser, solid state laser combined with a frequency shifter, or a gas discharge lamp, for example.

If the reaction light impinges on the gas mixture guided through the reaction chamber 110, at least a portion of the molecular oxygen $O_2$ contained in the gas mixture dissociates into excited oxygen atoms. The latter recombine, after transferring a part of their excitation energy to $N_2$ molecules, with remaining molecular oxygen $O_2$ to form ozone $O_3$. This chemical reaction happens also in the higher regions of the atmosphere and prevents VUV light from reaching the surface of the earth. The number density of ozone molecules in the gas flow emerging from the reaction chambers 110 and finally from the gas outlet apertures 44 can thus be controlled by individually changing the irradiance of the reaction light that enters the reaction chambers 110.

As a matter of course, the light sources 114 do not have to be arranged inside the gas supply unit 56, but may be located elsewhere. Furthermore, it is also possible to use only a single light source for all reaction chambers 110 and to control the amount of reaction light entering the reaction chambers 110 individually with the help of light modulators. Apart from that, also reaction light having a longer wavelength up to about 180 nm and even 240 nm is suitable for this purpose. From that it follows that also a small amount of projection light PL may be split off in the illumination system 12 and guided towards adjustable light modulators that direct it individually on the windows 112 of the reaction chambers 110.

V.

Correction Method

In the following it will be described how the transmission filter 42 may be used for apodization purposes.

In a first step the angular light distribution in the image plane 30 of the objective 20 is determined. This can be done either by measurements and/or by simulation. Simulation may be performed on the basis of experimental data and has the advantage that the operation of the apparatus 10 does not have to be disrupted for carrying out the measurements. Determining the angular light distribution by measurement, on the other hand, may be necessary if the highest possible accuracy is desired.

For measuring the angular light distribution, a measuring device 120 is arranged in the image plane 30 within the image field, as this is indicated in FIG. 2 by an arrow 122. Suitable measuring devices 120 are known in the art as such and typically comprise a CCD sensor and Fourier optics that translate angles in the image plane 30 into positions on the CCD sensor.

Also a mixed approach, which uses measurements as well as simulations, may be used to quickly and accurately determine the angular light distribution in the image plane 30.

In a next step the angular light distribution determined by simulation and/or measurement is compared to an ideal angular light distribution. This ideal angular light distribution is usually computed on the basis of the pattern 18 to be transferred on the light sensitive layer 22, the imaging properties of the objective 20 and the angular light distribution of the projection light when it impinges on the mask 16. The ideal angular light distribution is computed such that an optimum imaging of the pattern 18 on the light sensitive surface 22 is achieved. Optimization algorithms may be used to this end.

If this comparison results in intolerable deviations between the measured/simulated angular light distribution on the one hand and the ideal angular light distribution on the other hand, an algorithm computes a target transmittance distribution of the transmission filter 42 that is required to transform the measured/simulated angular light distribution into the ideal angular light distribution. This algorithm exploits the fact that the angular light distribution in the image plane 30 of the objective 22 corresponds to an irradiance distribution in the pupil plane 36 in which the transmission filter 42 is arranged.

Then the computational unit 52 of the transmission filter 42 controls the number density of ozone molecules in the gas flows 72, 172 such that the target transmittance distribution is obtained.

VI.

Important Method Steps

Figure 10:
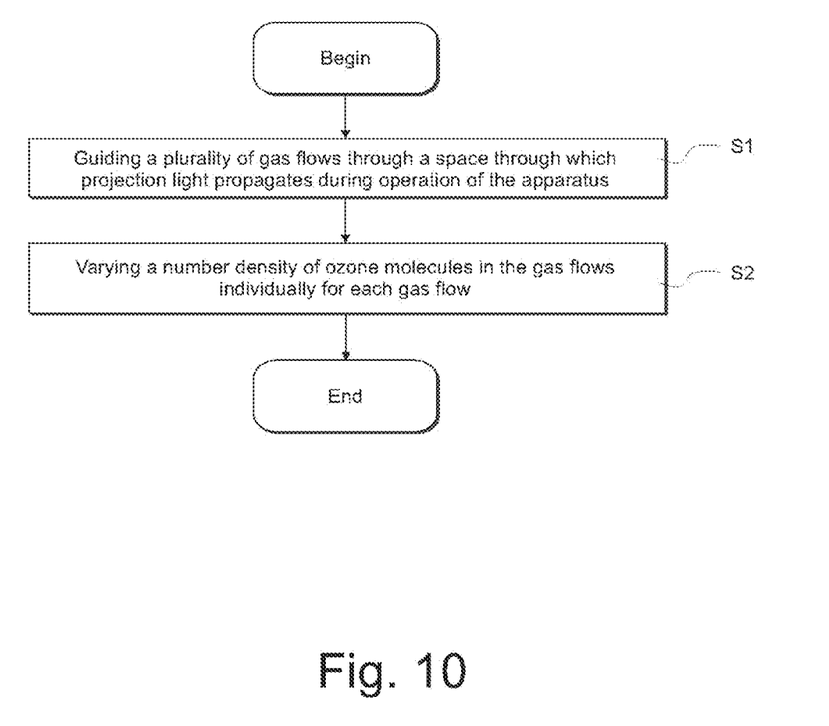
FIG. 10 is a flow diagram illustrating important method steps of the invention.

FIG. 10 is a flow diagram which summarizes important aspects of a method of varying a light irradiance distribution in a projection light path in the objective 22.

In a first step S1 a plurality of gas flows 72, 172 is guided through a space 55 through which projection light PL propagates during operation of the apparatus 10.

In a second step S2 a number density of ozone molecules in the gas flows 72, 172 is varied individually for each gas flow.

The invention claimed is:

1. An apparatus, comprising:
an objective comprising a transmission filter configured to variably modify a light irradiance distribution in a path of projection light through the objective, the transmission filter comprising:
  a plurality of gas outlet apertures configured so that, during operation of the transmission filter, the gas outlet apertures emit gas flows that intersect the path; and
  a control unit configured so that, during operation of the transmission filter, the control unit individually varies a number density of ozone molecules for each gas flow,
wherein:
  the apparatus is a microlithographic apparatus;
  the control unit comprises a gas supply unit connected to the gas outlet apertures;
  the gas supply unit comprises:
    a gas container containing a gas comprising molecular oxygen;
    a channel connected at an end to the gas container and terminating at an opposite end at a gas outlet aperture; and
    a light source configured so that, during use of the transmission filter, the light source produces reaction light that is directed onto the gas guided in the channel so that at least a portion of the molecular oxygen contained in the gas dissociates into atomic oxygen which, in turn, re-combines with molecular oxygen to form ozone;
  the reaction light has a center wavelength less than 240 nm; and
  the transmission filter is configured so that, during use of the transmission filter, the number density of ozone molecules in the gas flows varies by varying the irradiance of the reaction light directed on the gas.

2. The apparatus of claim 1, wherein the transmission filter is arranged at least substantially in a pupil plane of the objective.

3. The apparatus of claim 1, wherein groups of outlet apertures are arranged in parallel planes that are spaced apart along an optical axis of the objective.

4. The apparatus of claim 3, wherein plurality of gas outlet apertures configured so that, during operation of the transmission filter, the gas flows extend along directions that are different for each plane.

5. The apparatus of claim 1, wherein the transmission filter comprises a transparent optical element arranged in the space so that, during operation of the transmission filter, the transparent optical element separates two adjacent gas flows.

6. The apparatus of claim 5, wherein the transparent optical element comprises a plate, and the plate comprises parallel plane surfaces.

7. The apparatus of claim 1, wherein the transmission filter is configured so that, during operation of the transmission filter, the gas flows comprise a purge gas.

8. The apparatus of claim 7, wherein the control unit is configured so that, during operation of the transmission filter, the control unit varies a number density of purge gas atoms or molecules individually for each gas flow so that, for each gas flow when the number density of ozone molecules varies, the gas flow has a total pressure that does not vary by more than 0.5%.

9. The apparatus of claim 1, further comprising a measurement system configured so that, during use of the transmission filter, the measurement system measures an angular light distribution in an image plane of the objective, wherein the measurement system is connected to the control unit so that, during use of the transmission filter, the light irradiance distribution in the projection light path varies in response to measurement signals produced by the measurement system.

10. The apparatus of claim 1, further comprising an illumination system.

11. A method of using an apparatus, comprising:
using the apparatus to project an image of an illuminated mask onto a photoresist, wherein the apparatus comprises the apparatus of claim 1.

12. An objective, comprising:
a transmission filter configured to variably modify a light irradiance distribution in a path of projection light through the objective, the transmission filter comprising:

a plurality of gas outlet apertures configured so that, during operation of the transmission filter, the gas outlet apertures emit gas flows that intersect the path; and a control unit configured so that, during operation of the transmission filter, the control unit individually varies a number density of ozone molecules for each gas flow, wherein:

the apparatus is a microlithographic apparatus;

the control unit comprises a gas supply unit connected to the gas outlet apertures;

the gas supply unit comprises:

a gas container containing a gas comprising molecular oxygen;

a channel connected at an end to the gas container and terminating at an opposite end at a gas outlet aperture; and a light source configured so that, during use of the transmission filter, the light source produces reaction light that is directed onto the gas guided in the channel so that at least a portion of the molecular oxygen contained in the gas dissociates into atomic oxygen which, in turn, re-combines with molecular oxygen to form ozone;

the reaction light has a center wave-length less than 240 nm; and the transmission filter is configured so that, during use of the transmission filter, the number density of ozone molecules in the gas flows varies by varying the irradiance of the reaction light directed on the gas.

13. The objective of claim 12, wherein the transmission filter is arranged at least substantially in a pupil plane of the objective.

14. The apparatus of claim 12, wherein the control unit is configured so that, during operation of the transmission filter, the control unit varies a number density of purge gas atoms or molecules individually for each gas flow so that, for each gas flow when the number density of ozone molecules varies, the gas flow has a total pressure that does not vary by more than 0.5%.

* * * * *

UNITED STATES PATENT AND TRADEMARK OFFICE
CERTIFICATE OF CORRECTION

PATENT NO.         : 9,720,336 B2
APPLICATION NO.    : 14/851107
DATED              : August 1, 2017
INVENTOR(S)        : Holger Walter and Alexander Wolf It is certified that error appears in the above-identified patent and that said Letters Patent is hereby corrected as shown below:

Column 18, Line 5, Claim 12, delete "wave-length" and insert -- wavelength --.

Signed and Sealed this
Tenth Day of October, 2017

Joseph Matal
*Performing the Functions and Duties of the*
*Under Secretary of Commerce for Intellectual Property and*
*Director of the United States Patent and Trademark Office*